(12) United States Patent
Jia et al.

(10) Patent No.: US 10,872,922 B2
(45) Date of Patent: Dec. 22, 2020

(54) DISPLAY SUBSTRATE AND METHOD FOR MANUFACTURING THE SAME, FINGERPRINT RECOGNITION DEVICE AND DISPLAY DEVICE

(71) Applicant: BOE TECHNOLOGY GROUP CO., LTD., Beijing (CN)

(72) Inventors: Yanan Jia, Beijing (CN); Xue Dong, Beijing (CN); Jing Lv, Beijing (CN); Haisheng Wang, Beijing (CN); Yingming Liu, Beijing (CN); Xiaoliang Ding, Beijing (CN); Yuzhen Guo, Beijing (CN); Wei Liu, Beijing (CN); Yanling Han, Beijing (CN); Changfeng Li, Beijing (CN); Pengpeng Wang, Beijing (CN); Chun Wei Wu, Beijing (CN); Rui Xu, Beijing (CN); Lijun Zhao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 317 days.

(21) Appl. No.: 15/776,984

(22) PCT Filed: Sep. 28, 2017

(86) PCT No.: PCT/CN2017/103961
§ 371 (c)(1),
(2) Date: May 17, 2018

(87) PCT Pub. No.: WO2018/099176
PCT Pub. Date: Jun. 7, 2018

(65) Prior Publication Data
US 2019/0280039 A1    Sep. 12, 2019

(30) Foreign Application Priority Data

Dec. 1, 2016    (CN) .......................... 2016 1 1091448

(51) Int. Cl.
*H01L 27/16*    (2006.01)
*H01L 27/30*    (2006.01)
(Continued)

(52) U.S. Cl.
CPC ...... *H01L 27/14678* (2013.01); *G02F 1/1336* (2013.01); *G02F 1/13338* (2013.01);
(Continued)

(58) Field of Classification Search
CPC ............. H01L 27/14678; H01L 27/156; H01L 27/14623; H01L 27/14692; H01L 27/307;
(Continued)

(56) References Cited

U.S. PATENT DOCUMENTS

2013/0044384 A1    2/2013  Kim et al.
2014/0098305 A1*   4/2014  Mo ..................... G02F 1/13338
                                                          349/12

(Continued)

FOREIGN PATENT DOCUMENTS

CN    105678255 A    6/2016
CN    205334402 U    6/2016
(Continued)

OTHER PUBLICATIONS

First Chinese Office Action dated Oct. 15, 2018.
International Search Report dated Jan. 4, 2018.
Second Chinese Office Action dated May 8, 2019.

*Primary Examiner* — Bobbak Safaipour
(74) *Attorney, Agent, or Firm* — Dilworth & Barrese, LLP.; Michael J. Musella, Esq.

(57) ABSTRACT

A display substrate, a method for manufacturing the display substrate, a fingerprint recognition device and a display device are provided. The display substrate includes a base substrate, a black matrix sensor provided on the base substrate and a plurality of functional sensors which are spaced (Continued)

apart from each other, the black matrix sensor blocks at least visible light and includes a plurality of first extension portions and a plurality of second extension portions, and the first extension portions intersect the second extension portions to form a plurality of hollow regions. Orthographic projections of the functional sensors on the black matrix sensor are within the region where the black matrix sensor is located.

17 Claims, 6 Drawing Sheets

(51) Int. Cl.
    *G02F 1/1335*     (2006.01)
    *G02F 1/1333*     (2006.01)
    *G02F 1/13357*     (2006.01)
    *G06K 9/00*     (2006.01)
    *H01L 27/146*     (2006.01)
    *H01L 27/15*     (2006.01)
    *G02F 1/1368*     (2006.01)
    *H01L 27/32*     (2006.01)

(52) U.S. Cl.
    CPC ..... *G02F 1/133512* (2013.01); *G06K 9/0004* (2013.01); *H01L 27/14623* (2013.01); *H01L 27/14692* (2013.01); *H01L 27/156* (2013.01); *H01L 27/307* (2013.01); *G02F 1/1368* (2013.01); *G02F 2201/44* (2013.01); *H01L 27/14612* (2013.01); *H01L 27/3234* (2013.01)

(58) Field of Classification Search
    CPC .......... H01L 27/14612; H01L 27/3234; H01L 27/1443; H01L 27/1446; G02F 1/13338; G02F 1/133512; G02F 1/1336; G02F 1/1368; G02F 2201/44; G02F 2001/13324; G02F 1/13318; G02F 2001/13312; G06K 9/0004; G06K 9/22
    See application file for complete search history.

(56) References Cited

U.S. PATENT DOCUMENTS

| | | | |
|---|---|---|---|
| 2015/0198852 A1* | 7/2015 | Lee | G02F 1/134363 |
| | | | 257/72 |
| 2016/0216799 A1* | 7/2016 | Yang | G06F 3/0445 |
| 2017/0082894 A1* | 3/2017 | Katsuta | G02F 1/133504 |
| 2018/0211085 A1 | 7/2018 | Liu et al. | |
| 2018/0231827 A1* | 8/2018 | Choi | G02F 1/133512 |
| 2019/0056613 A1* | 2/2019 | Wang | G06F 3/044 |
| 2019/0115411 A1* | 4/2019 | Park | H01L 27/3272 |
| 2019/0353833 A1* | 11/2019 | Lin | G02B 5/201 |
| 2020/0105844 A1* | 4/2020 | Wang | H01L 27/326 |

FOREIGN PATENT DOCUMENTS

| | | |
|---|---|---|
| CN | 106201147 A | 12/2016 |
| CN | 106325582 A | 1/2017 |
| CN | 106559492 A | 4/2017 |
| JP | 2000019983 A | 1/2000 |
| WO | 2016148106 A1 | 9/2016 |

* cited by examiner

DISPLAY SUBSTRATE AND METHOD FOR MANUFACTURING THE SAME, FINGERPRINT RECOGNITION DEVICE AND DISPLAY DEVICE

The application claims priority to the Chinese patent application No. 201611091448.4 filed on Dec. 1, 2016, the entire disclosure of which is incorporated herein by reference as part of the present application.

TECHNICAL FIELD

Embodiments of the present disclosure relate to a display substrate and a method for manufacturing the display substrate, a fingerprint recognition device and a display device.

BACKGROUND

In the display field, a black matrix is a common light-blocking structure, is in a mesh structure and is in the non-display region of a display device, and the open regions of the mesh structure are corresponding to the sub-pixels of the display device, respectively. The black matrix is used to improve the contrast, avoid the color mixing and avoid the light reflection produced by the signal lines in the non-display region. At present, the black matrix is generally made of a black insulation material, for example, the black matrix is made of a resin material mixed with a black pigment.

The display device generally includes a variety of sensors, and how to integrate the sensors in the display device on the premise of ensuring the aperture opening rate is a research hotspot in the display field.

SUMMARY

At least one embodiment of the present disclosure provides a display substrate and a method for manufacturing the display substrate, a fingerprint recognition device and a display device, and the display device not only guarantees the aperture opening rate but also has a high integration degree.

At least one embodiment of the present disclosure provides a display device the display device includes a plurality of functional sensors which are spaced apart from each other, and a black matrix sensor which blocks at least visible light, the black matrix sensor includes a plurality of first extension portions and a plurality of second extension portions, and the first extension portions intersect the second extension portions to form a plurality of hollow regions. Orthographic projections of the functional sensors on the black matrix sensor are within a region where the black matrix sensor is located.

For example, the black matrix sensor is an optical sensor.

For example, the black matrix sensor includes a first electrode, a second electrode opposite to the first electrode and a semiconductor layer between the first electrode and the second electrode, the first electrode and the second electrode are successively arranged along a propagation direction of ambient light irradiating the display device, the first electrode is transparent, and the second electrode blocks at least visible light.

For example, the semiconductor layer includes a P-type semiconductor layer, an intrinsic semiconductor layer and an N-type semiconductor, a material of the intrinsic semiconductor layer is an amorphous silicon semiconductor, and a thickness of the intrinsic semiconductor layer is larger than 1 micron.

For example, the display device further includes an insulation layer which insulates the functional sensors from the black matrix sensor.

For example, each of the functional sensors is an optical sensor.

For example, the display device includes an array substrate and an opposite substrate opposite to the array substrate; and the array substrate or the opposite substrate includes the functional sensors and the black matrix sensor, and each of the functional sensors and the black matrix sensor are successively arranged along a propagation direction of ambient light irradiating the display device.

For example, each of the functional sensors includes a third electrode, a fourth electrode opposite to the third electrode and a semiconductor layer between the third electrode and the fourth electrode, and both the third electrode and the fourth electrode are transparent.

For example, the display device includes an array substrate and an opposite substrate opposite to the array substrate; and the array substrate includes the functional sensors and the opposite substrate includes the black matrix sensor.

For example, each of the functional sensors includes a light-blocking electrode, a transparent electrode opposite to the light-blocking electrode and a semiconductor layer between the light-blocking electrode and the transparent electrode, and the transparent electrode is between the light-blocking electrode and the black matrix sensor.

For example, the display device further includes a light source, and the functional sensor is configured to sense light emitted by the light source.

For example, the light source is at a periphery of the display device, or an orthographic projection of the light source on the black matrix sensor is within the region where the black matrix sensor is located.

For example, the black matrix sensor is an optical sensor, and the black matrix sensor is electrically connected with the light source and is configured to power the light source.

For example, the display device further includes a back light source, and the black matrix sensor is electrically connected with the back light source.

At least one embodiment of the present disclosure further provides a fingerprint recognition device, the fingerprint recognition device includes a plurality of fingerprint recognition sensors which are spaced apart from each other and a black matrix sensor which blocks at least visible light, the black matrix sensor includes a plurality of first extension portions and a plurality of second extension portions, and the first extension portions intersect the second extension portions to form a plurality of hollow regions. Orthographic projections of the fingerprint recognition sensors on the black matrix sensor are located within a region where the black matrix sensor is located.

At least one embodiment of the present disclosure further provides a display substrate, the display substrate includes a plurality of functional sensors which are spaced apart from each other and a black matrix sensor which blocks at least visible light, the black matrix sensor includes a plurality of first extension portions and a plurality of second extension portions, and the first extension portions intersect the second extension portions to form a plurality of hollow regions. Orthographic projections of the functional sensors on the black matrix sensor are within a region where the black matrix sensor is located.

At least one embodiment of the present disclosure further provides a method for manufacturing the above-mentioned the display substrate, and the method includes: forming the plurality of functional sensors and the black matrix sensor which includes a first electrode, a semiconductor layer and a second electrode. In the method, forming the black matrix sensor includes: forming a first electrode film and patterning the first electrode film to form the first electrode which is in a mesh shape, forming a semiconductor film and patterning the semiconductor film to form the semiconductor layer which is in a mesh shape, and forming a second electrode film and patterning the second electrode film to form the second electrode which is in a mesh shape; or forming the black matrix sensor includes: forming a first electrode film, a semiconductor film and a second electrode film which are stacked, and patterning the first electrode film, the semiconductor film and the second electrode film to form the first electrode which is in a mesh shape, the semiconductor layer which is in a mesh shape and the second electrode which is in a mesh shape.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment (s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1A:
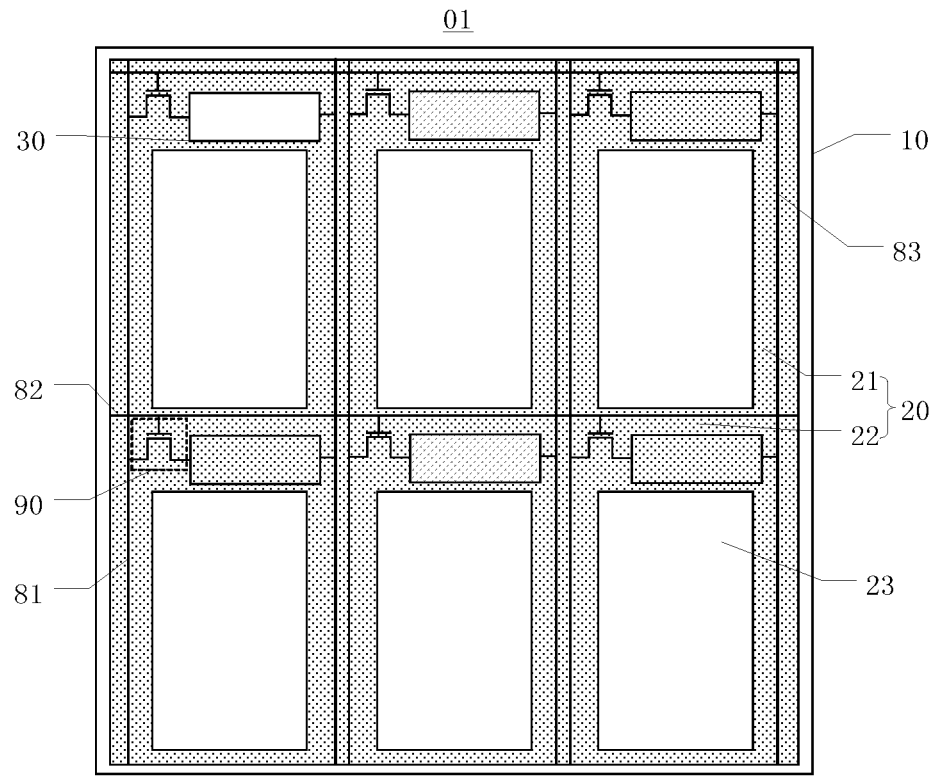
FIG. 1a is a schematic plan view of a display substrate provided by at least one embodiment of the present disclosure.
Figure 1B:
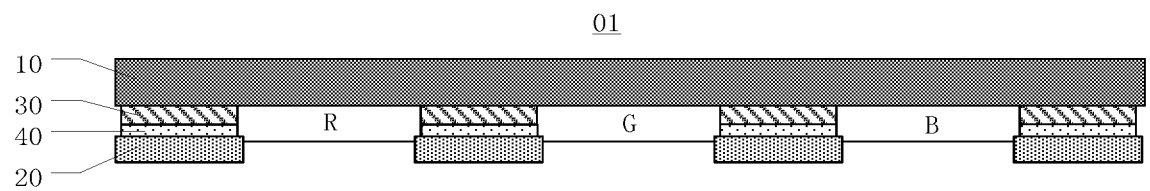
FIG. 1b is a schematic sectional view of the display substrate provided by at least one embodiment of the present disclosure.

As illustrated in FIG. 1a and FIG. 1b, at least one embodiment of the present disclosure further provides a display substrate 01, the display substrate 01 includes a base substrate 10 and a black matrix sensor 20 provided on the base substrate 10, the black matrix sensor 20 blocks at least visible light and includes a plurality of first extension portions 21 and a plurality of second extension portions 22, and the first extension portions 21 intersect the second extension portions 22 to form a plurality of hollow regions 23 so that a plan shape (that is, a plan-view shape) of the black matrix sensor 20 is a mesh shape. In at least one embodiment of the present disclosure, the first extension portions 21 and the second extension portions 22 of the black matrix sensor 20 are in a non-display region of the display substrate 01, and the hollow regions 23 formed due to intersecting of the first extension portions 21 and the second extension portions 22 are corresponding to a display region of the display substrate 01 (for example, color filter patterns R, color filter patterns G and color filter patterns B are respectively arranged in the hollow regions 23, as illustrated in FIG. 1b). The display substrate further includes a plurality of functional sensors 30 which are spaced apart from each other, and orthographic projections of the functional sensors 30 on the black matrix sensor 20 are in a region where the black matrix sensor 20 is located.

In at least one embodiment of the present disclosure, the integration degree of a display device is improved by using the black matrix sensor 20; and because the region where the black matrix sensor 20 is located is a non-display region, arranging the functional sensors 30 within the non-display region where the black matrix sensor 20 is located prevents the aperture opening rate from being affected by the functional sensors 30.

It should be noted that the visible light is a perceptible portion for a human eye in the electromagnetic wave spectrum. For example, the wavelength range of the visible light is about 380 nm~780 nm, for example, 400 nm~760 nm.

In at least one embodiment of the present disclosure, because the black matrix sensor 20 blocks at least the visible light, the black matrix sensor 20 has a function of blocking light which is similar to the function of a black matrix made of a black insulation material; furthermore, because the black matrix sensor is a sensor, a required sensing function is achieved by the black matrix sensor by selecting the type of the black matrix sensor according to an actual requirement.

For example, the black matrix sensor 20 is an optical sensor and has a function of blocking light by absorbing at least the light from an external environment. Because the optical sensor converts the light irradiating it into electricity, making the black matrix sensor 20 by an optical sensor enables the black matrix sensor 20 to have a variety of applications. For example, a current signal produced by an optical sensor increases with the enhancement of ambient light and decreases with the weakening of the ambient light, and according to this principle, in a case where the black matrix sensor 20 is an optical sensor, changes of the ambient light is sensed by the black matrix sensor 20. For example, the black matrix sensor 20 is also used as a solar battery, and by connecting the black matrix sensor 20 with an electrical component, the black matrix sensor 20 is used as a power source of the electrical component.

For example, the base substrate 10 is a substrate with a supporting function, such as a glass substrate, a quartz substrate or a plastic substrate.

For example, as illustrated in FIG. 1a and FIG. 1b, the display substrate 01 provided by at least one embodiment of the present disclosure further includes: a plurality of functional sensors 30 which are spaced apart from each other and provided at a side of the base substrate 10, at which side the black matrix sensor 20 is provided; and an insulation layer 40 which is on the base substrate 10 and insulates the functional sensors 30 from the black matrix sensor 20 to avoid the short circuit between the functional sensors 30 and the black matrix sensor 20. In at least one embodiment of the present disclosure, the required sensing function is realized by arranging the functional sensors 30. For example, the functional sensors 30 are used as touch sensors for realizing a function of touch control; or the functional sensors 30 are used as fingerprint recognition sensors for realizing a function of fingerprint recognition; or the functional sensors 30 are used for realizing other functions. For example, the functional sensors can be capacitive, resistive, ultrasonic, or optical sensors or pressure sensors.

For example, as illustrated in FIG. 1a, the display substrate 01 provided by at least one embodiment of the present disclosure further includes a plurality of switch elements 90, and each of the switch elements 90 is connected with a functional sensor 30 to control the reading of the signal of the functional sensor 30. For example, first signal lines 81, second signal lines 82 and third signal lines 83 are provided on the base substrate 10; and each of the switch elements 90, for example, is a transistor, and a source electrode of the transistor is connected with a corresponding first signal line 81, a gate electrode of the transistor is connected with a corresponding second signal line 82, a drain electrode is connected with a corresponding functional sensor 30, and the output terminal of the functional sensor 30 is connected with a corresponding third signal line 83 to output a signal through the third signal line 83. The position relationship of the first signal line, the second signal line and the third second signal line in FIG. 1a is only illustrative, and embodiments of the present disclosure include, but are not limited to, the structure shown in FIG. 1a.

For example, as illustrated in FIG. 1a and FIG. 1b, orthographic projections of the functional sensors 30 on the black matrix sensor 20 are within the region where the black matrix sensor 20 is located. In this case, a plan shape of the insulation layer 40, for example, is a mesh shape. Because the region where the black matrix sensor 20 is located is the non-display region, arranging the functional sensors 30 within the non-display region where the black matrix sensor 20 is located can prevent the aperture opening rate from being affected by the functional sensors 30.

For example, each of the functional sensors 30 is an optical sensor. In at least one embodiment of the present disclosure, for example, in a case that a touch occurs, the functional sensor 30 which is the optical sensor absorbs a reflection light at a touch positon and produces a light current, and the touch position is positioned or a fingerprint is recognized according to the light current.

For example, in a case where the functional sensors 30 are optical sensors and in the region in which the black matrix sensor 20 is located, the black matrix sensor 20 is light-tight, in this way, besides the visible light, the black matrix sensor 20 also blocks the light of other wavelengths, and thus the interference caused by that the visible light and the light of other wavelengths are sensed by the functional sensors 30 is avoided.

Figure 2A:
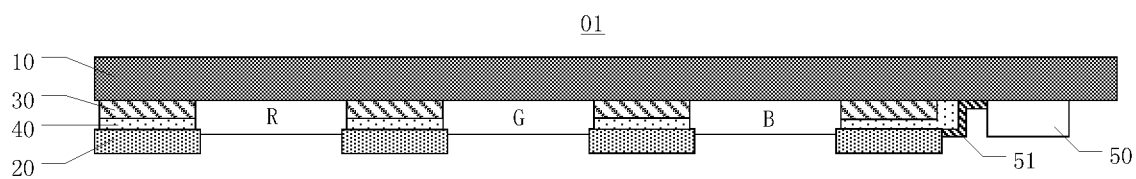
FIG. 2a is a first schematic sectional view of the display substrate, which includes a light source, provided by at least one embodiment of the present disclosure.
Figure 2B:
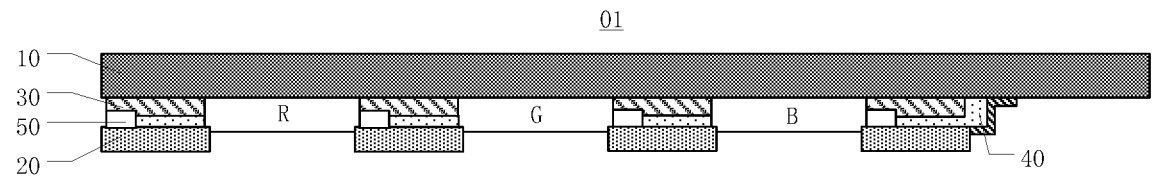
FIG. 2b is a second schematic sectional view of the display substrate, which includes the light source, provided by at least one embodiment of the present disclosure.

For example, as illustrated in FIG. 2a and FIG. 2b, in a case where each of the functional sensors 30 is an optical sensor, the display substrate 01 provided by at least one embodiment of the present disclosure further includes a light source 50 provided on the base substrate 10, and the functional sensor 30 is configured to sense light emitted from the light source 50, that is, the light source 50 is configured to emit the light which is to be sensed by the functional sensor 30.

For example, as illustrated in FIG. 2a, the light source 50 is at the periphery of the display substrate 01, which can realize a touch detection or a fingerprint recognition in a local region, for example; or as illustrated in FIG. 2b, an orthographic projection of the light source 50 on the black matrix sensor 20 is in the region where the black matrix sensor 20 is located (for example, the light source 50 is between the black matrix sensor 20 and the base substrate 10), which can realize a touch detection or a fingerprint recognition in the full screen, for example.

For example, the light source 50 is an infrared light source, such as an infrared light-emitting diode (LED), accordingly, the functional sensors 30 are infrared sensors to avoid that the ambient light interferes with the detection result of the functional sensors in a case where the functional sensors 30 are optical sensors. For example, the light source 50 can also be any other type of light source which can emit light of a predetermined wavelength; accordingly, the functional sensors 30 can sense the light of the predetermined wavelength.

For example, as illustrated in FIG. 2a and FIG. 2b, the black matrix sensor 20 is an optical sensor and the black matrix sensor 20 is electrically connected with the light source 50 (for example, the black matrix sensor 20 is electrically connected with the light source 50 via a signal line 51) and is configured to power the light source 50. In at least one embodiment of the present disclosure, because the black matrix sensor 20 is an optical sensor, the black matrix sensor 20 can be used as a power source of the light source 50 by supplying a light current produced by the black matrix sensor 20 after the black matrix sensor 20 absorbs light to the light source 50, and thus the light source 50 needs no additional power source.

In the following, the structures of the black matrix sensor 20 and the functional sensors 30 in the display substrate provided in the present disclosure are described in detail in connection with FIG. 3a and FIG. 3b.

For example, in a case where the black matrix sensor 20 is an optical sensor, the black matrix sensor 20 is a photodiode. For example, as illustrated in FIG. 3a and FIG. 3b, the black matrix sensor 20 includes a first electrode 21, a second electrode 22 opposite to the first electrode 21 and a semiconductor layer 23 between the first electrode 21 and the second electrode 22.

For example, the first electrode 21 and the second electrode 22 are successively arranged along the propagation direction of the ambient light irradiating the display substrate; the first electrode 21 is transparent, so that the ambient light or other incident light is enabled to be incident to the semiconductor layer 23 of the black matrix sensor 20 and is absorbed by the semiconductor layer 23; and the second electrode 22 is impervious to at least visible light (for example, the second electrode 22 is light-tight) so as to enable the black matrix sensor 20 to block at least the visible light.

For example, the first electrode 21 is made of one or several kinds of transparent conductive materials such as indium tin oxide, indium zinc oxide and indium gallium zinc oxide.

For example, the second electrode 22 is a non-transparent metal electrode, and for example, the second electrode 22 is made of one or several kinds of metal materials such as gold, silver, aluminum, aluminum alloy, copper, copper alloy, zirconium, titanium, molybdenum and molybdenum niobium alloy. The second electrode 22 can be non-transparent by controlling the thickness of the second electrode 22.

For example, the semiconductor layer 23 is made of an organic semiconductor material or an inorganic semiconductor material, and the organic semiconductor material or the inorganic semiconductor material is sensitive to light of predetermined wavelengths. For example, the semiconductor layer 23 made of the inorganic semiconductor material is formed by PECVD (plasma enhanced chemical vapor deposition) method.

For example, the semiconductor layer 23 includes a plurality of semiconductor sub-layers which are stacked, and the band gaps of at least two of the semiconductor sub-layers are different. Forming the semiconductor layer 23 by using a stacked structure of semiconductor sub-layers with different band gaps is beneficial to broadening the absorption spectrum of the semiconductor layer 23.

Figure 3A:
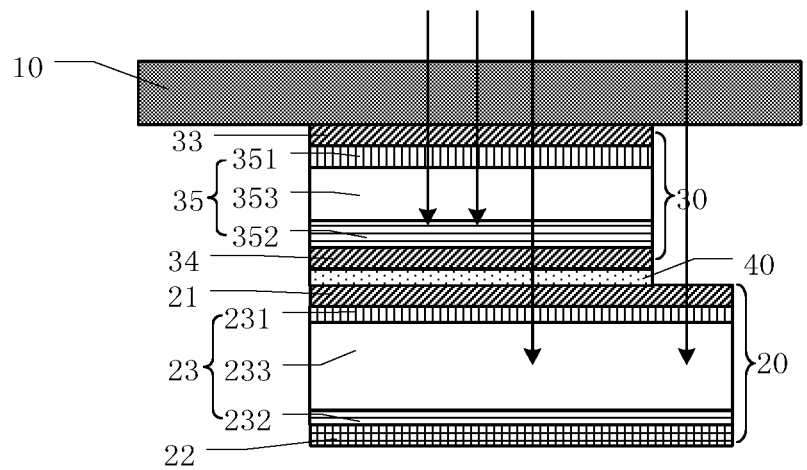
FIG. 3a and FIG. 3b are schematic structural views of a display device provided by at least one embodiment of the present disclosure in which a functional sensor and a black matrix sensor are successively arranged along a propagation direction of ambient light.
Figure 3B:
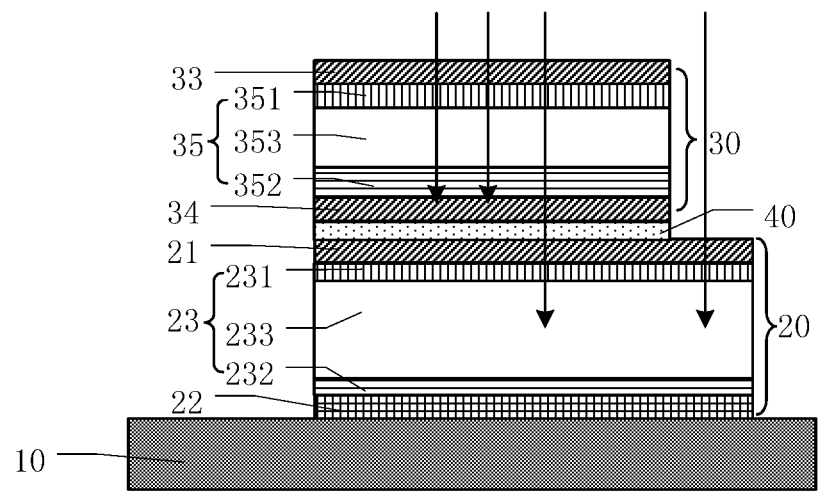

For example, the semiconductor layer 23 has a structure of PIN or a structure of NIP, and as illustrated in FIG. 3a and FIG. 3b, the semiconductor layer 23 includes a P-type semiconductor layer 231, an intrinsic semiconductor layer 233 and an N-type semiconductor 232, which are arranged successively. It should be noted that the position of the P-type semiconductor layer 231 and the position of the N-type semiconductor layer 232 are interchangeable. For example, the intrinsic semiconductor layer 233 includes a plurality of semiconductor sub-layers with different band gaps to broaden the absorption spectrum of the intrinsic semiconductor layer 233 and enhance the light-blocking effect of the black matrix sensor 20.

For example, a material of the intrinsic semiconductor layer 233 is an amorphous silicon semiconductor, and a thickness of the intrinsic semiconductor layer 233 is larger than 1 micron. With this arrangement, the absorption spectrum of the semiconductor layer 23 can cover the main wave range of the visible light, and thus it is ensured that the semiconductor layer 23 almost absorbs the entire visible light incident to the surface of the semiconductor layer 23.

For example, a method for manufacturing the black matrix sensor 20 includes: forming a first electrode film and patterning the first electrode film to form the first electrode 21 which is in a mesh shape; forming a semiconductor film and patterning the semiconductor film to form the semiconductor layer 23 which is in a mesh shape; and forming a second electrode film and patterning the second electrode film to form the second electrode 22 which is in a mesh shape.

For example, a method for manufacturing the black matrix sensor 20 includes: first, forming a first electrode film, a semiconductor film and a second electrode film which are stacked; and then patterning the first electrode film, the semiconductor film and the second electrode film to form the first electrode 21 which is in a mesh shape, the semiconductor layer 23 which is in a mesh shape and the second electrode 22 which is in a mesh shape.

In the above-mentioned manufacturing method, each of the first electrode film, the semiconductor film and the second electrode film has a structure of an integrated film; and the process of patterning is a process of forming a required pattern, for example, a photolithographic process or an inkjet printing process or the like.

For example, in a case where the functional sensors 30 are optical sensors, the functional sensors 30 are photodiodes. For example, as illustrated in FIG. 3a and FIG. 3b, each of the functional sensors 30 includes a third electrode 33, a fourth electrode 34 opposite to the third electrode 33 and a semiconductor layer 35 between the third electrode 33 and the fourth electrode 34. In other embodiments of the present disclosure, the functional sensors 30 can also be photosensitive thin film transistors or other types of optical sensors.

For example, the third electrode 33 and the fourth electrode 34 are successively arranged along the propagation direction of the ambient light irradiating the display substrate 01, and the third electrode 33 is transparent. In at least one embodiment of the present disclosure, because the third electrode 33 is transparent, the ambient light is incident to the semiconductor layer 35 after passing through the third electrode 33 and thus is sensed by the functional sensors 30.

For example, on the basis that the third electrode 33 is transparent, the fourth electrode 34 is also transparent. In at least one embodiment of the present disclosure, because the fourth electrode 34 is transparent, the ambient light which is not absorbed by the semiconductor layer 35 passes through the fourth electrode 34 and is not reflected by the fourth electrode 34, which can avoid affecting the display result; on the other hand, because both the two electrodes of the functional sensor 30 are transparent electrodes, the ambient light is incident to the black matrix sensor 20 after passing through the functional sensor 30 and thus is absorbed by the black matrix sensor 20.

For example, both the third electrode 33 and the fourth electrode 34 are made of one or several kinds of transparent conductive materials such as indium tin oxide, indium zinc oxide and indium gallium zinc oxide.

For example, the semiconductor layer 35 is made of an organic semiconductor material or an inorganic semiconductor material, and the organic semiconductor material or the inorganic semiconductor material is sensitive to light of predetermined wavelengths.

For example, the semiconductor layer 35 has a PIN or NIP structure, as illustrated in FIG. 3a and FIG. 3b, the semiconductor layer 35 includes a P-type semiconductor layer 351, an intrinsic semiconductor layer 353 and an N-type semiconductor 352, which are arranged successively. It should be noted that the position of the P-type semiconductor layer 351 and the position of the N-type semiconductor layer 352 are interchangeable.

For example, in a case where the functional sensors 30 are optical sensors, as illustrated in FIG. 3a and FIG. 3b, each of the functional sensors 30 and the black matrix sensor 20 are successively arranged along the propagation direction of the ambient light incident to the display substrate 01. In this way, when a touch occurs, the light reflected by a user's finger is sensed by the functional sensors 30 and is not blocked by the black matrix sensor 20.

For example, in a case where the functional sensors 30 and the black matrix sensor 20 are optical sensors and both the third electrode 33 and the fourth electrode 34 of each functional sensor 30 are transparent, the operation mode of the functional sensors 30 and the black matrix sensor 20 is described below. When a touch occurs, a touch mode (or a fingerprint recognition mode) is started, and at this time, because the functional sensors 30 are close to the finger of a user, the functional sensors 30 absorb the light reflected by the finger (for example, the light is visible light or infrared light) and generate a current, and a touch positon is positioned (or a fingerprint is determined) according to the current; when no touch occurs, a normal display mode is started, and the functional sensors 30 do not work at this time. Both in a stage when the touch occurs and in a stage when no touch occurs, the black matrix sensor 20 converts the light irradiating it into electricity to play a role of blocking light. For example, a portion of the black matrix sensor 20, which portion is right under the functional sensors 30, absorbs the light passing through the functional sensors 30, and the other portion of the black matrix sensor 20 absorbs the ambient light or other incident light.

For example, the peak value of the spectral response of the black matrix sensor 20 is different from the peak value of the spectral response of the functional sensors 30. For example, the peak value of the spectral response of the black matrix sensor 20 is broader than the peak value of the spectral response of the functional sensors 30, so that the black matrix sensor 20 can more fully absorb the light which is not absorbed by the functional sensors 30.

For example, the display substrate provided by at least one embodiment of the present disclosure is a color filter substrate including a color filter layer (for example, the color filter layer includes color filter patterns as shown in FIG. 1b), as illustrated in FIG. 3a; and in this case, along a direction perpendicular to the base substrate 10, the functional sensors 30 are between the black matrix sensor 20 and the base substrate 10. For example, in a case where the display substrate is the color filter substrate, both the functional sensors 30 and the black matrix sensor 20 are manufactured by an inkjet printing process or other common processes. For example, the color filter layer is formed after forming the functional sensors 30 and the black matrix sensor 20; or the functional sensors 30 and the black matrix sensor 20 is formed after forming the color filter layer.

For example, the display substrate provided by at least one embodiment of the present disclosure can also be an array substrate including a plurality of pixel electrodes or a plurality of light-emitting units (for example, organic light emitting diodes), as illustrated in FIG. 3b; and in this case, along a direction perpendicular to the base substrate 10, the black matrix sensor 20 is between the functional sensors 30 and the base substrate 10.

Figure 4A:
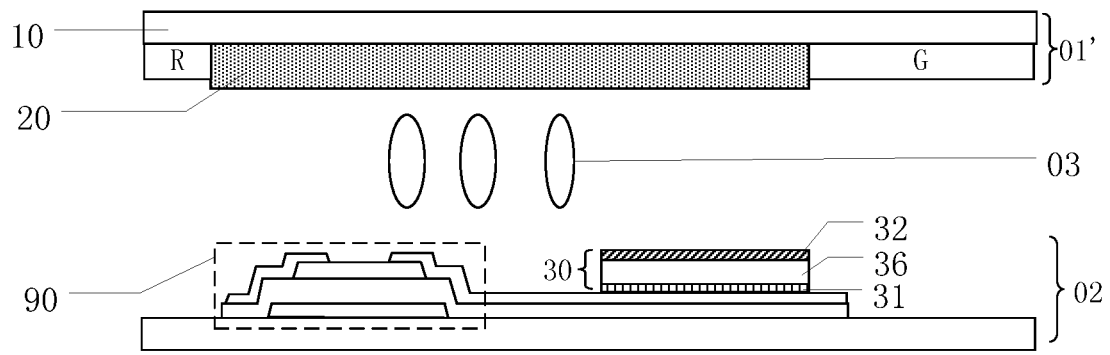
FIG. 4a is a schematic structural view of the display device provided by at least one embodiment of the present disclosure in which the black matrix sensor and the functional sensor are provided in different substrates.
Figure 4B:
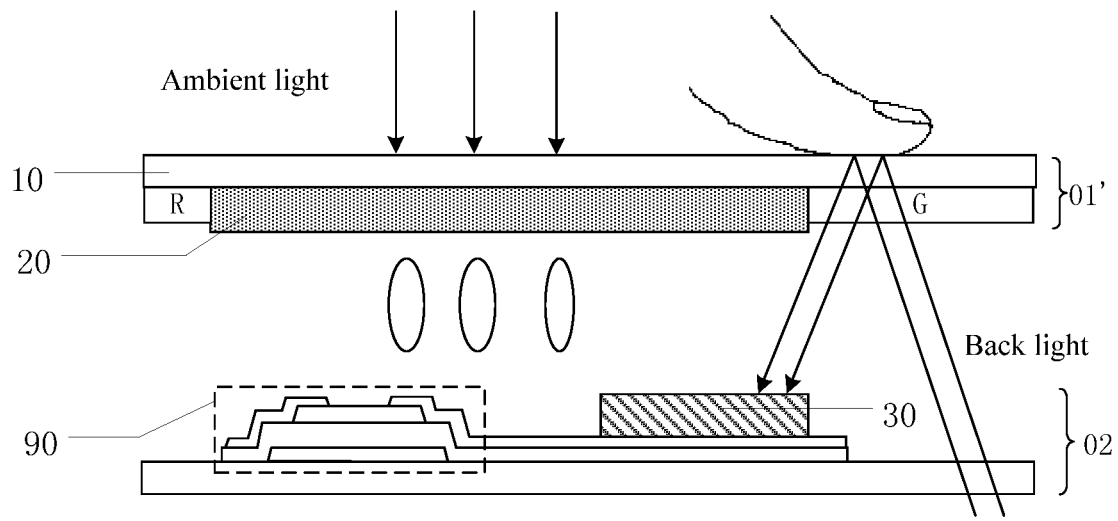
FIG. 4b is a schematic view illustrating a light path when the display device illustrated in FIG. 4a is touched.
Figure 4C:
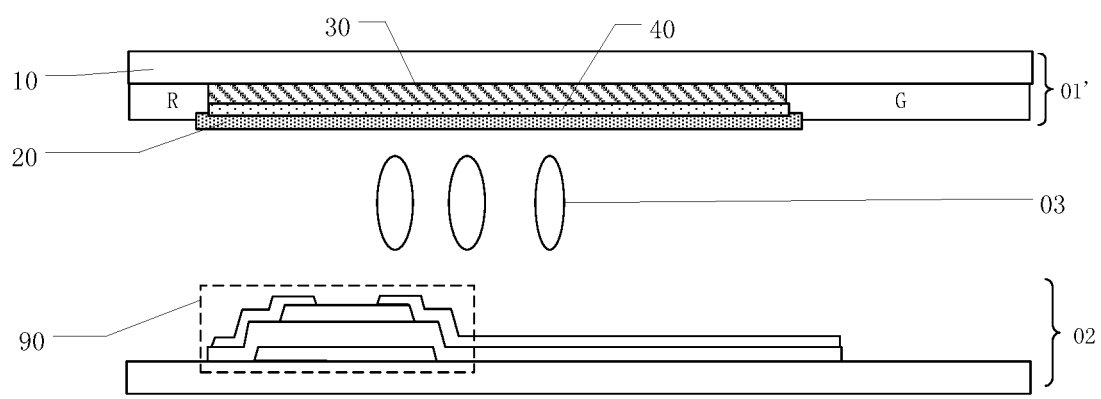
FIG. 4c is a schematic structural view of the display device provided by at least one embodiment of the present disclosure in which the black matrix sensor and the functional sensor are provided in a same substrate.

At least one embodiment of the present disclosure further provides a display device. As illustrated in FIGS. 4a to 4c, the display device includes a black matrix sensor 20 and a plurality of functional sensors 30 which are spaced apart from each other. The black matrix sensor 20 blocks at least visible light. The structure of the black matrix sensor 20 can be referred to the related description in the embodiments of the display substrate 01 described above. For example, referring to FIG. 1a, the black matrix sensor 20 includes a plurality of first extension portions 21 and a plurality of second extension portions 22, and the first extension portions 21 intersect the second extension portions 22 to form a plurality of hollow regions 23. Orthographic projections of the functional sensors 30 on the black matrix sensor 20 are within a region where the black matrix sensor 20 is located. In at least one embodiment of the present disclosure, the integration degree of the display device is improved by using the black matrix sensor 20; and because the region where the black matrix sensor 20 is located is a non-display region, arranging the functional sensors 30 in the non-display region where the black matrix sensor 20 is located can prevent the opening ratio from being affected by the functional sensors 30.

For example, the display device includes an array substrate 02 and an opposite substrate 01' opposite to the array substrate 02, and the opposite substrate 01' is at the display side of the display device. For example, a liquid crystal layer 03 is provided between the array substrate 02 and the opposite substrate 01', that is, the display device is a liquid crystal display device. For example, the array substrate 02 is an active light-emitting array substrate, for example, organic light-emitting diode array substrate.

For example, the array substrate 02 or the opposite substrate 01' includes both the functional sensors 30 and the black matrix sensor 20, and each of the functional sensors 30 and the black matrix sensor 20 are successively arranged along the propagation direction of ambient light irradiating the display device, that is, at the position where each of the functional sensors 30 overlaps the black matrix sensor 20, the ambient light irradiates the functional sensor 30 first, and then irradiates the black matrix sensor 20 after passing through the functional sensor 30, as illustrated in FIG. 3a and FIG. 3b. For example, in at least one embodiment of the present disclosure, as illustrated in FIG. 4c, both the functional sensors 30 and the black matrix sensor 20 are in the opposite substrate 01'; in this case, the functional sensors 30 are between the black matrix sensor 20 and the opposite substrate 01'; and for example, the opposite substrate 01' is the display substrate 01 provided by any one of the above embodiments.

For example, in a case where the functional sensors 30 and the black matrix sensor 20 are in a same substrate, referring to FIG. 4c, the display device further includes an insulation layer 40 between each of the functional sensors 30 and the black matrix sensor 20, and the insulation layer 40 insulates the functional sensor 30 from the black matrix sensor 20.

For example, in at least one embodiment of the present disclosure, the black matrix sensor and the functional sensors are in different substrates respectively. For example, as illustrated in FIG. 4a and FIG. 4b, the array substrate 02 includes the functional sensors 30 and the opposite substrate 01' includes the black matrix sensor 20. For example, in this case, both the array substrate 02 and the opposite substrate 01' are in a display panel, and for example, the liquid crystal layer 03 is provided between the array substrate 02 and the opposite substrate 01'. The array substrate 02 includes the plurality of functional sensors 30 which are spaced apart from each other, and the orthographic projections of the functional sensors 30 on the black matrix sensor 20 are within the region where the black matrix sensor 20 is located. For example, each of the functional sensors 30 is connected with a corresponding switch element 90 (the arrangement of the switch element 90 can be referred to the related description in embodiments of the display substrate, and repeated description is omitted herein).

For example, the functional sensors 30 are used as touch control sensors for realizing a function of touch control; or the functional sensors 30 are used as fingerprint recognition sensors for realizing a function of fingerprint recognition; or the functional sensors are sensors for realizing other functions. For example, the functional sensors are capacitive, resistive, ultrasonic, or optical sensors or pressure sensors.

For example, the functional sensors 30 are optical sensors. For example, when a touch occurs, the functional sensors 30 which are optical sensors are used to absorb the reflection light at a touch positon and produce a light current, and the touch position is positioned or a fingerprint is recognized according to the light current.

For example, in a case where the functional sensors 30 are optical sensors, the display device illustrated in FIG. 4a and FIG. 4b is a liquid crystal display device (as illustrated in FIG. 4a and FIG. 4b, the display device further includes the liquid crystal layer 03), and the operation mode of the display device is: referring to FIG. 4b, when the display device is touched by a user's finger, back light from a back light source is detected by the functional sensors 30 after being reflected by the finger, and a touch position is determined or a fingerprint is recognized according to a detection result.

For example, in a case where the functional sensors 30 are optical sensors, the black matrix sensor 20 is light-tight, in this way, besides visible light, the black matrix sensor 20 also blocks the light of other wavelengths, and thus the interference caused by that the visible light and the light of other wavelengths are sensed by the functional sensors 30 is avoided.

For example, in a case where the array substrate 02 includes the functional sensors 30 and the opposite substrate 01' includes the black matrix sensor 20, referring to an embodiment illustrated in FIG. 4a and FIG. 4b, and in a case where the functional sensors 30 are optical sensors, the functional sensors 30 are photodiodes. For example, each of the functional sensors 30 includes a light-blocking electrode 31, a transparent electrode 32 opposite to the light-blocking electrode 31 and a semiconductor layer 36 between the light-blocking electrode 31 and the transparent electrode 32, and the transparent electrode 32 is between the light-blocking electrode 31 and the black matrix sensor 20 in a direction perpendicular to the base substrate 10. In a case where the display device is a liquid crystal display device, because the light-blocking electrode 31 of the functional sensor 30 is non-transparent, it is avoided that the back light emitted by a back light source is not reflected by the finger but is sensed directly by the functional sensors 30 and thus the detection result of touch control is affected. In other embodiments of the present disclosure, the functional sensors 30 can also be photo-sensitive thin film transistors or other types of optical sensors.

For example, the transparent electrode 32 is made of one or several kinds of transparent conductive materials such as indium tin oxide, indium zinc oxide and indium gallium zinc oxide.

For example, the light-blocking electrode 31 is a non-transparent metal electrode, and for example, the light-blocking electrode 31 is made of one or several kinds of metal materials such as gold, silver, aluminum, aluminum alloy, copper, copper alloy, zirconium, titanium, molybdenum and molybdenum niobium alloy. The light-blocking electrode 31 is made non-transparent by controlling the thickness of the light-blocking electrode 31.

For example, the semiconductor layer 36 is made of an organic semiconductor material or an inorganic semiconductor material which is sensitive to light of predetermined wavelengths.

For example, in a case where the functional sensors 30 are optical sensors, the functional sensors 30 are photodiodes. In this case, the structure of the functional sensors 30 can be referred to the related description in the embodiments of the display substrate 01.

For example, referring to FIG. 3a and FIG. 3b, each of the functional sensors 30 includes a third electrode 33, a fourth electrode 34 opposite to the third electrode 33 and a semiconductor layer 35 between the third electrode 33 and the fourth electrode 34. For example, the semiconductor layer 35 includes a P-type semiconductor layer 351, an intrinsic semiconductor layer 353 and an N-type semiconductor 352, which are arranged successively.

For example, in a case where the functional sensors 30 and the black matrix sensor 20 are in a same substrate, each of the functional sensors 30 includes a third electrode 33, a fourth electrode 34 opposite to the third electrode 33 and a semiconductor layer 35 between the third electrode 33 and the fourth electrode 34, and both the third electrode 33 and the fourth electrode 34 are transparent.

For example, the black matrix sensor 20 is an optical sensor and plays a role of blocking light by absorbing at least light from external environment.

For example, the black matrix sensor 20 is a photodiode. In this case, the structure of the black matrix sensor 20 can be referred to the related description in the embodiments of the display substrate 01.

For example, as illustrated in FIG. 3a and FIG. 3b, the black matrix sensor 20 includes a first electrode 21, a second electrode 22 opposite to the first electrode 21 and a semiconductor layer 23 between the first electrode 21 and the second electrode 22, the first electrode 21 and the second electrode 22 are successively arranged along the propagation direction of ambient light irradiating the display device, the first electrode 21 is transparent and the second electrode 22 blocks at least visible light.

For example, the semiconductor layer 23 includes a P-type semiconductor layer, an intrinsic semiconductor layer and an N-type semiconductor, which are arranged successively, a material of the intrinsic semiconductor layer is an amorphous silicon semiconductor, and a thickness of the intrinsic semiconductor layer is larger than 1 micron. For example, as illustrated in FIG. 3a and FIG. 3b, the semiconductor layer 23 includes a P-type semiconductor layer 231, an intrinsic semiconductor layer 233 and an N-type semiconductor 232, which are arranged successively.

Because an optical sensor can convert the light irradiating it into electricity, in a case where the black matrix sensor 20 is an optical sensor, the black matrix sensor 20 can have a variety of applications. For example, according to the principle that a current signal produced by an optical sensor increases with the enhancement of the ambient light and decreases with the weakening of the ambient light, changes of the ambient light is sensed by the black matrix sensor 20; For example, the black matrix sensor 20 can also be used as a solar battery and be connected with an electrical component, so that the black matrix sensor 20 is used as a power source of the electrical component. In the following, applications of the black matrix sensor 20 are described in detail in connection with FIG. 5.

For example, in a case where the black matrix sensor 20 is an optical sensor, the black matrix sensor 20 is electrically connected with a light source and is configured to power the light source.

Figure 5:
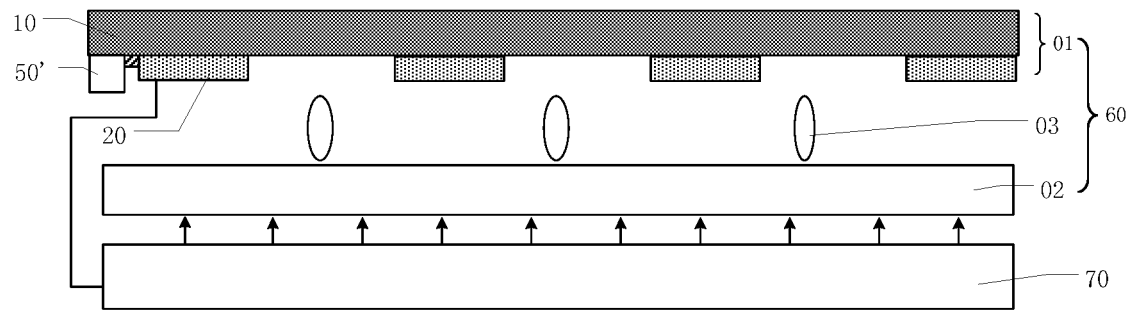
FIG. 5 is a schematic structural view of the display device, which includes the light source and a back light source, provided by at least one embodiment of the present disclosure.

For example, as illustrated in FIG. 5, the display device provided by at least one embodiment of the present disclosure further includes a light source 50', and the light source 50' is configured to emit the light which is used for touch detection. For example, the light which is used for touch detection is sensed by the functional sensors 30 (referring to FIG. 1a) included in the opposite substrate 01' (for example, the display substrate 01), that is, the functional sensors 30 are configured to sense the light emitted by the light source 50'; and the black matrix sensor 20 is electrically connected with the light source 50' and is configured to power the light source 50'. In at least one embodiment of the present disclosure, in a case where the black matrix sensor 20 is an optical sensor, the black matrix sensor 20 is used as a solar battery, and by connecting the black matrix sensor 20 with the light source 50' (for example, an infrared LED (light-emitting diode)), the light source 50' can emit light and thus the light source 50' needs no additional power source. It should be noted that limitations are not imposed to the position of the light source 50' in the display device. For example, the light source 50' is formed on the opposite substrate 01', and the light source 50' is in the non-display region or in the display region to realize a touch detection or a fingerprint recognition of high signal-noise ratio.

FIG. 5 shows an example that the light source 50' is at the periphery of the display device, which can realize a touch detection or a fingerprint recognition in a local region, for example; or an orthographic projection of the light source 50' on the black matrix sensor 20 is within the region where the black matrix sensor 20 is located, which can realize a touch detection or a fingerprint recognition in a full screen, for example.

For example, the display device further includes a back light source. In a case where the black matrix sensor 20 is an optical sensor, the black matrix sensor 20 is electrically connected with the back light source and is configured to adjust the brightness of the back light source.

For example, as illustrated in FIG. 5, the display device provided by at least one embodiment of the present disclosure further includes a display panel 60 and a back light source 70 which is configured to supply back light (referring to the arrows in FIG. 5) to the display panel 60, and the display panel 60 includes the opposite substrate 01' (for example, the display substrate 01), and the black matrix sensor 20 of the opposite substrate 01' is electrically connected with the back light source 70. The display device provided by at least one embodiment of the present disclosure, for example, is a liquid crystal display device. In at least one embodiment of the present disclosure, in a case where the black matrix sensor 20 is an optical sensor, the current produced by the black matrix sensor 20 changes with the change of the ambient light, and by connecting the black matrix sensor 20 with the back light source 70, the brightness of the back light source 70 is controlled by utilizing the black matrix sensor 20.

Figure 6:
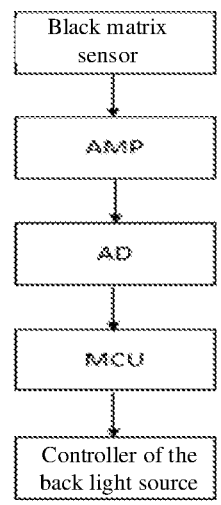
FIG. 6 is a schematic diagram of a flow direction of a current signal when the black matrix sensor is connected with the back light source in the display device provided by at least one embodiment of the present disclosure.

FIG. 6 is a schematic diagram of a flow direction of a current signal when the black matrix sensor is connected with the back light source in the display device provided by at least one embodiment of the present disclosure. As illustrated in FIG. 6, the black matrix sensor is connected with an amplifier (AMP), and a signal reaches a controller of the back light source after passing through a digital analog converter (AD) and a microcontroller unit (MCU) to control the brightness of the back light, which enables the brightness of the display device to increase under a strong light environment (for example, outdoors) and decrease under a weak light environment (for example, indoors or at night), so that a user's eye is protected.

For example, the display device provided by at least one embodiment of the present disclosure can be any product or component having a display function, such as a liquid crystal panel, an e-Paper, an OLED (organic light-emitting diode) panel, a mobile phone, a panel computer, a TV set, a display, a laptop, a digital photo frame, a navigation instrument or the like.

At least one embodiment of the present disclosure further provides a method for manufacturing the above-mentioned display substrate, and the method includes: forming the black matrix sensor which includes a first electrode, a semiconductor layer and a second electrode.

Figure 7A:
FIG. 7a to FIG. 7f are schematic structural views of steps of forming the black matrix sensor in a method for manufacturing the display substrate provided by at least one embodiment of the present disclosure.
Figure 7B:
Figure 7C:
Figure 7D:
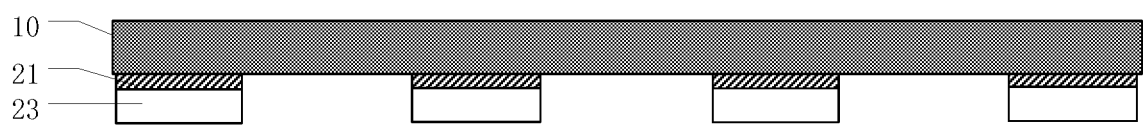
Figure 7E:
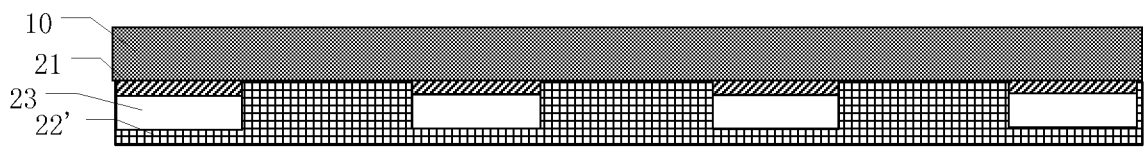
Figure 7F:
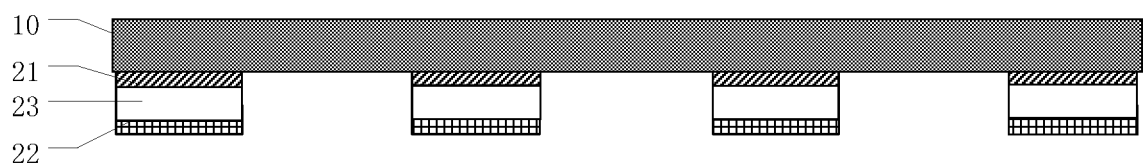

For example, as illustrated in FIGS. 7a to 7f, forming the black matrix sensor includes: as illustrated in FIG. 7a, forming a first electrode film 21' on the base substrate 10, and patterning the first electrode film 21' to form the first electrode 21 which is in a mesh shape, as illustrated in FIG. 7b; as illustrated in FIG. 7c, forming a semiconductor film 23' on the base substrate 10, and patterning the semiconductor film 23' to form the semiconductor layer 23 which is in a mesh shape, as illustrated in FIG. 7d; as illustrated in FIG. 7e, forming a second electrode film 22' on the base substrate 10, and patterning the second electrode film 22' to form the second electrode 22 which is in a mesh shape, as illustrated in FIG. 7f.

Figure 8:
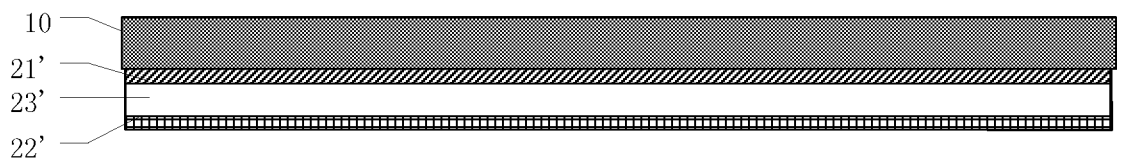
FIG. 8 is a schematic structural view of a first electrode film, a semiconductor film and a second electrode film which are formed in a stack structure in the method for manufacturing the display substrate provided by at least one embodiment of the present disclosure.

For example, forming the black matrix sensor includes: as illustrated in FIG. 8, forming a first electrode film 21', a semiconductor film 23' and a second electrode film 22' which are stacked, and patterning the first electrode film 21', the semiconductor film 23' and the second electrode film 22' to form the first electrode 21 which is in a mesh shape, the semiconductor layer 23 which is in a mesh shape and the second electrode 22 which is in a mesh shape, as illustrated in FIG. 7f.

The forming of the first electrode and the forming of the second electrode are interchangeable.

Figure 9:
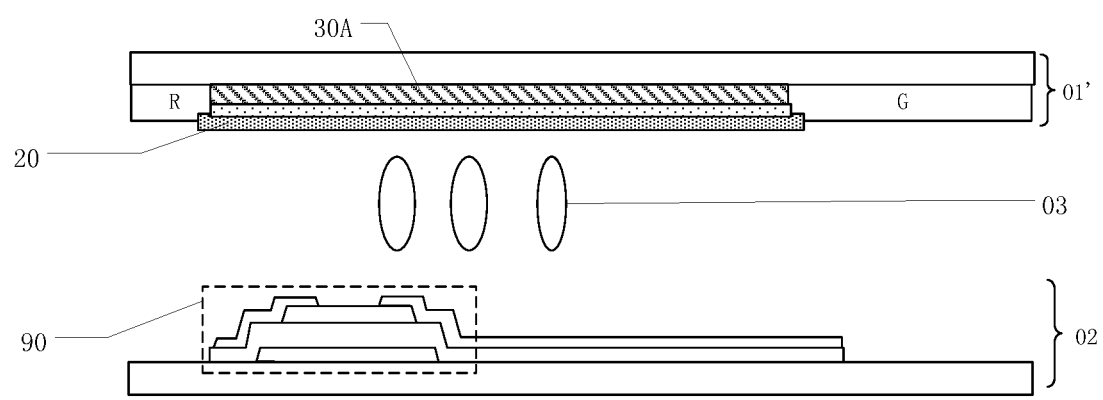
FIG. 9 is a schematic sectional view of a fingerprint recognition device provided by at least one embodiment of the present disclosure.

At least one embodiment of the present disclosure further provides a fingerprint recognition device, as illustrated in FIG. 9, the fingerprint recognition device includes a plurality of fingerprint recognition sensors 30A which are spaced apart from each other and a black matrix sensor 20 which blocks at least visible light. In the fingerprint recognition device, the structure of the black matrix sensor 20 can be referred to the related description in the embodiments of the display substrate 01. For example, referring to FIG. 1*a*, the black matrix sensor 20 includes a plurality of first extension portions 21 and a plurality of second extension portions 22, and the first extension portions 21 intersect the second extension portions 22 to form a plurality of hollow regions 23. Orthographic projections of the fingerprint recognition sensors 30A on the black matrix sensor 20 are within a region where the black matrix sensor 20 is located.

For example, the structure of the fingerprint recognition sensors 30A can be referred to the related description in the embodiments of the display substrate 01.

For example, the fingerprint recognition device is the display device provided by any one of the above-mentioned embodiments, that is, the fingerprint recognition device includes the opposite substrate 01' (which is, for example, the above-mentioned display substrate 01), the array substrate 02 which includes a plurality of switch elements 90 and the liquid crystal layer between the opposite substrate 01' and the array substrate 02.

In summary, the display substrate, the method for manufacturing the display substrate, the fingerprint recognition device and the display device provided by embodiments of the present disclosure have advantages as follows.

1. In at least one embodiment of the present disclosure, by using the black matrix sensor, not only a light-blocking function is realized, but also a required sensing function is realized by selecting the type of the sensor according to the actual requirement, and thus the integration degree of the display device is improved.

2. In at least one embodiment of the present disclosure, because the functional sensors are within the region where the black matrix sensor is located, the aperture opening ratio is ensured.

3. In at least one embodiment of the present disclosure, transparent functional sensors are adopted and each of the functional sensors and the black matrix sensor are optical sensors and are successively arranged along the propagation direction of ambient light irradiating the display substrate, which enables the black matrix sensor to absorb the light which is reflected by the finger and is not absorbed by the functional sensors, so that light reflection caused by the lower electrodes of the functional sensors is avoided.

4. In at least one embodiment of the present disclosure, because the black matrix sensor is an optical sensor, by electrically connecting the black matrix sensor with the back light source, the brightness of the back light source is adjusted, and the integration degree of the display device is improved.

5. In at least one embodiment of the present disclosure, because the black matrix sensor is an optical sensor, by connecting the black matrix sensor with the light source which provides the light used for touch detection, the black matrix sensor is used to power the light source, and thus no additional power source is needed and the integration degree of the display device is improved.

The embodiments of display substrate, the method for manufacturing the display substrate, the fingerprint recognition device and the display device of the present disclosure can be referred to each other, and repeated descriptions are omitted herein.

The following should be noted: (1) only the structures involved in the embodiments of the present disclosure are involved in the drawings of the embodiments of the present disclosure, and other structures can refer to usual designs; (2) the thickness and shape of each film in the drawings do not reflect the real scale, and the purpose is just to illustrate the content of the embodiments of the present disclosure schematically; (3) the embodiments and features in different embodiments of the present disclosure can be combined in case of no conflict.

What are described above is related to the illustrative embodiments of the disclosure only and not limitative to the scope of the disclosure; the scopes of the disclosure are defined by the accompanying claims.

What is claimed is:

1. A display device, comprising:
   a plurality of functional sensors which are spaced apart from each other; and
   a black matrix sensor which blocks at least visible light, wherein the black matrix sensor comprises a plurality of first extension portions and a plurality of second extension portions, and the first extension portions intersect the second extension portions to form a plurality of hollow regions,
   wherein orthographic projections of the functional sensors on the black matrix sensor are within a region where the black matrix sensor is located; and
   wherein the black matrix sensor comprises an optical sensor; and wherein the black matrix sensor comprises a first electrode, a second electrode opposite to the first electrode and a semiconductor layer between the first electrode and the second electrode, the first electrode and the second electrode are successively arranged along a propagation direction of ambient light irradiating the display device, the first electrode is transparent, and the second electrode blocks at least the visible light.

2. The display device according to claim 1, wherein the semiconductor layer comprises a P-type semiconductor layer, an intrinsic semiconductor layer and an N-type semiconductor, a material of the intrinsic semiconductor layer comprises an amorphous silicon semiconductor, and a thickness of the intrinsic semiconductor layer is larger than 1 micron.

3. The display device according to claim 1, further comprising:
   an insulation layer which insulates the functional sensors from the black matrix sensor.

4. The display device according to claim 1, wherein each of the functional sensors comprises an optical sensor.

5. The display device according to claim 4, wherein
   the display device comprises an array substrate and an opposite substrate opposite to the array substrate; and
   the array substrate or the opposite substrate comprises the functional sensors and the black matrix sensor, and each of the functional sensors and the black matrix sensor are successively arranged along a propagation direction of ambient light irradiating the display device.

6. The display device according to claim 5, wherein each of the functional sensors comprises a third electrode, a fourth electrode opposite to the third electrode and a semiconductor layer between the third electrode and the fourth electrode, and both the third electrode and the fourth electrode are transparent.

7. The display device according to claim 4, wherein
   the display device comprises an array substrate and an opposite substrate opposite to the array substrate; and
   the array substrate comprises the functional sensors and the opposite substrate comprises the black matrix sensor.

8. The display device according to claim 7, wherein each of the functional sensors comprises a light-blocking electrode, a transparent electrode opposite to the light-blocking electrode and a semiconductor layer between the light-blocking electrode and the transparent electrode, and the transparent electrode is between the light-blocking electrode and the black matrix sensor.

9. The display device according to claim 4, further comprising a light source, wherein the functional sensors are configured to sense light emitted by the light source.

10. The display device according to claim 9, wherein the light source is at a periphery of the display device, or an orthographic projection of the light source on the black matrix sensor is within the region where the black matrix sensor is located.

11. The display device according to claim 9, wherein the black matrix sensor comprises an optical sensor, and the black matrix sensor is electrically connected with the light source and is configured to power the light source.

12. The display device according to claim 1, further comprising a back light source, wherein the black matrix sensor is electrically connected with the back light source.

13. The display device according to claim 1, wherein
the display device comprises an array substrate and an opposite substrate opposite to the array substrate; and
the array substrate or the opposite substrate comprises the functional sensors and the black matrix sensor, and each of the functional sensors and the black matrix sensor are successively arranged along a propagation direction of ambient light irradiating the display device.

14. The display device according to claim 13, wherein each of the functional sensors comprises a third electrode, a fourth electrode opposite to the third electrode and a semiconductor layer between the third electrode and the fourth electrode, and both the third electrode and the fourth electrode are transparent.

15. A fingerprint recognition device, comprising:
a plurality of fingerprint recognition sensors which are spaced apart from each other; and
a black matrix sensor which blocks at least visible light, wherein the black matrix sensor comprises a plurality of first extension portions and a plurality of second extension portions, and the first extension portions intersect the second extension portions to form a plurality of hollow regions,
wherein orthographic projections of the fingerprint recognition sensors on the black matrix sensor are within a region where the black matrix sensor is located; and
wherein the black matrix sensor comprises an optical sensor; and wherein the black matrix sensor comprises a first electrode, a second electrode opposite to the first electrode and a semiconductor layer between the first electrode and the second electrode, the first electrode and the second electrode are successively arranged along a propagation direction of ambient light irradiating the display device, the first electrode is transparent, and the second electrode blocks at least the visible light.

16. A display substrate, comprising:
a plurality of functional sensors which are spaced apart from each other; and
a black matrix sensor which blocks at least visible light, wherein the black matrix sensor comprises a plurality of first extension portions and a plurality of second extension portions, and the first extension portions intersect the second extension portions to form a plurality of hollow regions,
wherein orthographic projections of the functional sensors on the black matrix sensor are within a region where the black matrix sensor is located; and
wherein the black matrix sensor comprises an optical sensor; and wherein the black matrix sensor comprises a first electrode, a second electrode opposite to the first electrode and a semiconductor layer between the first electrode and the second electrode, the first electrode and the second electrode are successively arranged along a propagation direction of ambient light irradiating the display device, the first electrode is transparent, and the second electrode blocks at least the visible light.

17. A method for manufacturing the display substrate according to claim 16, comprising:
forming the plurality of functional sensors and the black matrix sensor which comprises a first electrode, a semiconductor layer and a second electrode,
wherein forming the black matrix sensor comprises:
forming a first electrode film and patterning the first electrode film to form the first electrode which is in a mesh shape, forming a semiconductor film and patterning the semiconductor film to form the semiconductor layer which is in a mesh shape, and forming a second electrode film and patterning the second electrode film to form the second electrode which is in a mesh shape; or
forming a first electrode film, a semiconductor film and a second electrode film which are stacked, and patterning the first electrode film, the semiconductor film and the second electrode film to form the first electrode which is in a mesh shape, the semiconductor layer which is in a mesh shape and the second electrode which is in a mesh shape.

\* \* \* \* \*